United States Patent
Lee et al.

(10) Patent No.: US 8,395,385 B2
(45) Date of Patent: Mar. 12, 2013

(54) SIMULTANEOUS EXCITATION AND ACQUISITION OF SIGNAL FROM MULTIPLE SLICES IN THE RARE SEQUENCE (MULTIPLEX RARE)

(75) Inventors: Kuan Jin Lee, Freiburg (DE); Jochen Leupold, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 246 days.

(21) Appl. No.: 12/662,158

(22) Filed: Apr. 1, 2010

(65) Prior Publication Data

US 2010/0259260 A1 Oct. 14, 2010

(30) Foreign Application Priority Data

Apr. 8, 2009 (EP) .................................. 09 157 581

(51) Int. Cl.
*G01V 3/00* (2006.01)
*G01R 33/20* (2006.01)
(52) U.S. Cl. ......... 324/307; 324/309; 324/310; 324/312
(58) Field of Classification Search .......... 324/300–322; 600/407–435; 382/128–131
See application file for complete search history.

(56) References Cited

U.S. PATENT DOCUMENTS

| | | | |
|---|---|---|---|
| 5,237,273 A | 8/1993 | Plewes | |
| 5,281,916 A * | 1/1994 | Hinks et al. | 324/309 |
| 5,446,384 A | 8/1995 | Dumoulin | |
| 5,818,229 A * | 10/1998 | Kanazawa | 324/309 |
| 6,400,151 B1 * | 6/2002 | Haase et al. | 324/309 |
| 6,489,766 B1 * | 12/2002 | Alsop | 324/313 |
| 6,614,225 B1 | 9/2003 | Feinberg | |
| 6,842,000 B2 * | 1/2005 | Norris et al. | 324/309 |
| 6,882,150 B2 * | 4/2005 | Jenniskens et al. | 324/309 |
| 6,946,839 B2 * | 9/2005 | Porter | 324/309 |
| 7,027,853 B2 * | 4/2006 | Ma | 600/410 |
| 7,084,626 B2 * | 8/2006 | Ma et al. | 324/309 |
| 7,205,763 B2 * | 4/2007 | Porter | 324/306 |
| 7,358,729 B2 * | 4/2008 | Ma et al. | 324/307 |
| 2004/0064032 A1 * | 4/2004 | Ma | 600/410 |
| 2004/0071324 A1 * | 4/2004 | Norris et al. | 382/128 |
| 2004/0257078 A1 * | 12/2004 | Porter | 324/307 |
| 2005/0001616 A1 * | 1/2005 | Jenniskens et al. | 324/307 |

(Continued)

FOREIGN PATENT DOCUMENTS

EP 2239592 A1 * 10/2010
GB 2 320 576 6/1998

OTHER PUBLICATIONS

R.T. Constable et al., "Factors Influencing Contrast in Fast Spin-Echo MR Imaging", Magnetic Resonance Imaging, vol. 10, pp. 497-511, 1992.

(Continued)

*Primary Examiner* — Melissa Koval
*Assistant Examiner* — Tiffany Fetzner
(74) *Attorney, Agent, or Firm* — Paul Vincent

(57) ABSTRACT

A method for RARE magnetic resonance imaging comprising slice selective excitation of two or more slices and of one or more nuclei, followed by refocusing of these slices and application of gradient pulses which cause a division of the signal into spin echoes and stimulated echoes, is characterized by application of refocusing slice selective RF pulses, which are placed to fulfill the echo-spacing CPMG condition for each slice and by arrangement of gradient pulses which cause the phase accumulated by spins in each slice between two consecutive refocusing RF pulses corresponding to that slice to be equal, thus fulfilling the CPMG phase accumulation condition. Thereby, the obtainable signal can be increased and stabilized.

9 Claims, 10 Drawing Sheets

U.S. PATENT DOCUMENTS

| | | | | |
|---|---|---|---|---|
| 2005/0030025 | A1* | 2/2005 | Ma et al. | 324/309 |
| 2005/0237057 | A1* | 10/2005 | Porter | 324/307 |
| 2006/0094952 | A1* | 5/2006 | Ma et al. | 600/410 |
| 2010/0259260 | A1* | 10/2010 | Lee et al. | 324/309 |
| 2012/0025825 | A1* | 2/2012 | Porter | 324/309 |

OTHER PUBLICATIONS

K.F. King "Maintaining th CPMG Conditions with Slice Accelerated Parallel Imaging in 2D Fast Spin Echo", Proc. Intl. Soc. Mag. Reson. Med. 14 (2006), 2434 ff.

Hennig, J. et al., "RARE Imaging: A Fast Imaging Method for Clinical MR", Magnetic Resonance in Medicine, Academic Press, Duluth, MN, US, vol. 3, Jan. 1, 1986, pp. 823-833.

Altbach, Maria I. et al., "1084 A double-inversion radial FSE and GRASE methods for the evaluation of cardiac masses", Journal of Cardiovascular Magnetic Resonance, Biomed Central Ltd., London UK, vol. 10, No. Suppl. 1, Oct. 22, 2008, p. A209.

Jingfei, MA. et al., "Fast Spin-Echo Triple-Echo Dixon (fTED) Technique for Efficient T2-Weighted Water and Fat Imaging", Magnet Resonance in Medicine, Academic Press, Duluth, MN, US, vol. 58, No. 1, Jul. 1, 2007, pp. 103-109.

Patel, M.R. et al., "Half-Fourier Acquisition Single-Shot Turbo Spin-Echo (HASTE) MR: Comparison with Fast Spin-Echo MR in Diseases of the Brain", American Journal of Neuroradiology, American Society of Neuroradiology, US, vol. 18, No. 9, Oct. 1, 1997 pp. 1635-1640.

Feinberg, D. A. et al., "Gradient-Echo Shifting in Fast MRI Techniques (GRASE Imaging) for Correction of Field Inhomogeneity Errors and Chemical Shift", Journal of Magnetic Resonance, Academic Press, London, GB, vol. 97, Mar. 1, 1992, pp. 177-183.

Hennig, J. et al., "Hyperechoes", Magnetic Resonance in Medicine, Academic Press, Duluth, MN, US, vol. 46, No. 1, Jul. 1, 2001, pp. 6-12.

Hahn, E. L. "Spin Echoes", Physical Review, 1950 80: p. 580-594.

Gunther, M. and D.A. Feinberg, "Simultaneous Spin-Echo Refocusing" Magnetic Resonance in Medicine, 2005. 54(3): p. 513-523.

Xiang, Q. S. "Two-Point Water-Fat Imaging with Partially-Opposed-Phase (POP) Acquisition: an Asymmetric Dixon Method", Magn. Reson Med., 2006. 56(3): p. 572-84.

Ma, J. F. et al., "Fast Spin-Echo Triple-Echo Dixon (fTED) technique for Efficient T-2-Weighted Water and Fat Imaging", Magnetic Resonance in Medicine, 2007. 58(1): p. 103-109.

Glover, G. H. "Multipoint Dixon Technique for Water and Fat Proton and Susceptibility Imaging", J.Magn. Reson Imaging, 1991. 1(5): p. 521-530.

Reeder, S. B. et al. "Multicoil Dixon Chemical Species Separation with an Iterative Least-Squares Estimation Method", Magn. Reson Med. 2004. 51(1): p. 35-45.

Kuan J. Lee et al., "Multiplex RARE: A Simultaneous Multislice Spin-Echo Sequence That Fulfils CPMG Conditions", Magnetic Resonance in Medicine 64:299-305 (2010).

Jonathan E. Bishop, et al., "TE Interleaving: New Multisection Imaging Technique", JMRI 1991: vol. 1:531-538.

Peter A. Hardy, et al., "Separation of Fat and Water in Fast Spin-Echo MR Imaging with the Three-Point Dixon Technique", JMRI 1995: vol. 5:181-185.

Jingfei Ma, et al., "Method for Efficient Fast Spin Echo Dixon Imaging", Magnetic Resonance in Medicine 48:1021-1027 (2002).

Gaby S. Pell et al., "Optimized Clinical T2 Relaxometry With a Standard CPMG Sequence", Journal of Magnetic Resonance Imaging 23:248-252 (2006).

Joseph R. Roebuck et al., "Carr-Pucell-Meiboom-Gill imaging of prostate cancer: quantitative $T_2$ values for cancer discrimination" Magnetic Resonance Imaging 27 (2009) 497-502.

Philippe S. Melki et al., "Partial RF Echo Planar Imaging with the FAISE Method I. Experimental and Theoretical Assessment of Artifact" Magnetic Resonance in Medicine 26, 328-341 (1992).

* cited by examiner

SIMULTANEOUS EXCITATION AND ACQUISITION OF SIGNAL FROM MULTIPLE SLICES IN THE RARE SEQUENCE (MULTIPLEX RARE)

This application claims Paris convention priority to EP 09 157 581.1 filed Apr. 8, 2009 the entire disclosure of which is hereby incorporated by reference.

BACKGROUND OF THE INVENTION

The present invention relates to a method for RARE magnetic resonance imaging comprising slice selective excitation of two or more slices and of one or more nuclei, followed by refocusing of these slices and application of gradient pulses which cause a diversion of the signal into spin echoes and stimulated echoes.

Such nuclear magnetic resonance signal is frequently measured by means of the spin echo method known from [1].

After a period te/2, the excited magnetization is refocused with an RF pulse and a spin echo is formed after a further time period te/2. The signal maximum is achieved if the flip angle of the refocusing pulse is exactly 180 degree. To increase efficiency of data acquisition, long echo trains can be used, a technique called RARE [2]. To reduce RF energy deposition from a long train of refocusing pulses, the hyperecho method may be used [3].

In 2003, the simultaneous image refocusing method (SIR) was introduced [4]. As described in the patent, with this technique, total imaging time is reduced when any "preparation" is used. Preparation here refers to RF pulses, gradient lobes and delays which, for example, are used to encode for a particular contrast. It can also include phase encoding, and crusher gradients. The time is reduced because these components are shared between two or more slices. However, when applying SIR to a RARE sequence, the CPMG conditions are not met, and to prevent interference from stimulated echoes, special spoiler schemes are required to spoil incorrectly timed echoes [5].

U.S. Pat. No. 5,237,273 describes a spin-echo sequence for a multi-slice NMR scan from three separate slices. The major disadvantage of this method is its relatively long acquisition time.

It is a major object of the present invention to increase and stabilize the obtainable signal.

SUMMARY OF THE INVENTION

According to the present invention, this is achieved by application of refocusing slice selective RF pulses, which are placed to fulfill the echo-spacing CPMG condition for each slice and by arrangement of gradient pulses which cause the phase accumulated by spins in each slice between two consecutive refocusing RF pulses corresponding to that slice to be equal, thus fulfilling the CPMG phase accumulation condition.

The present invention presents a modification of the SIR method in which the CPMG conditions are met for all excited slices. Then, constructive interference of spin echoes and stimulated echoes is obtained. An example in which this invention may be used to speed up so-called Fat-water Dixon imaging is described in detail.

In general, the invention presents a method of data acquisition for RARE (otherwise also known as FSE or TSE) magnetic resonance imaging. Two or more slices are excited, one after another, per repetition time. Signal from each slice is refocused with a train of slice selective RF pulses which are placed to fulfill the echo-spacing CPMG condition for each slice. The gradient lobes for each slice are set to ensure that the phase accrued by signals in the period between refocusing pulses is always equal. For example, one way of doing this for the slice select direction is to use the slice select gradient of one slice as spoiler for the other slice(s). In this way, the Carr-Purcell-Meiboom-Gill (CPMG) conditions for each slice are met, and the primary and stimulated echoes always occur together for all signals from all excited slices. This technique can improve efficiency in data collection because firstly, it is not necessary to wait for the echo train for one slice to finish before collecting signal from other slices; secondly, crusher gradients, phase encoding lobes and preparatory components are shared between slices; thirdly, in certain applications, such as Dixon fat-water imaging, the time on one side of the spin-echo from one slice may be used to acquire signals from the other slice(s).

A preferred variant of the method according to the present invention is characterized in that one or more gradients for one slice acts as the spoiler for other slice(s). This enables the signal from one slice to be unaliased from the signals from other simultaneously excited slices.

In another favored variant, the slices occupy the same position, but correspond to different precession frequencies of the targeted nuclei. Instead of being slice selective, the excitation and refocusing can be frequency selective which offers potential application in spectroscopic imaging.

A further advantageous variant of the inventive method, in which the flip angles of all excitation pulses and all refocusing pulses are independently from each other variable, reduces the power deposition in the sample i.e. the human body.

Still another variant of the method according to the present invention is characterized in that the gradient pulses are arranged to perform multi-echo Dixon imaging. The method is especially useful for multi-echo spin-echo Dixon imaging because it allows faster volume coverage. This will most often be an example for using the sequence for fat/water separation.

Further examples for making advantageous use of the sequence according to the invention are characterized in that preparatory pulses are used in addition to the slice excitation pulses to obtain different contrasts.

In particular, inversion pulses or fat saturation pulses may be used as preparatory pulses.

Yet another variant of the inventive method is characterized in that asymmetric echoes are acquired. These asymmetric echoes are preferably used for partial Fourier reconstruction, thereby reducing the total acquisition time. Also, the use of undersampling for acceleration is most favorable. For performing the method according to the present invention, multiple transmit and/or receiver coils can be used.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is illustrated in the figures of the drawing.

DESCRIPTION OF THE PREFERRED EMBODIMENT

Figure 1:
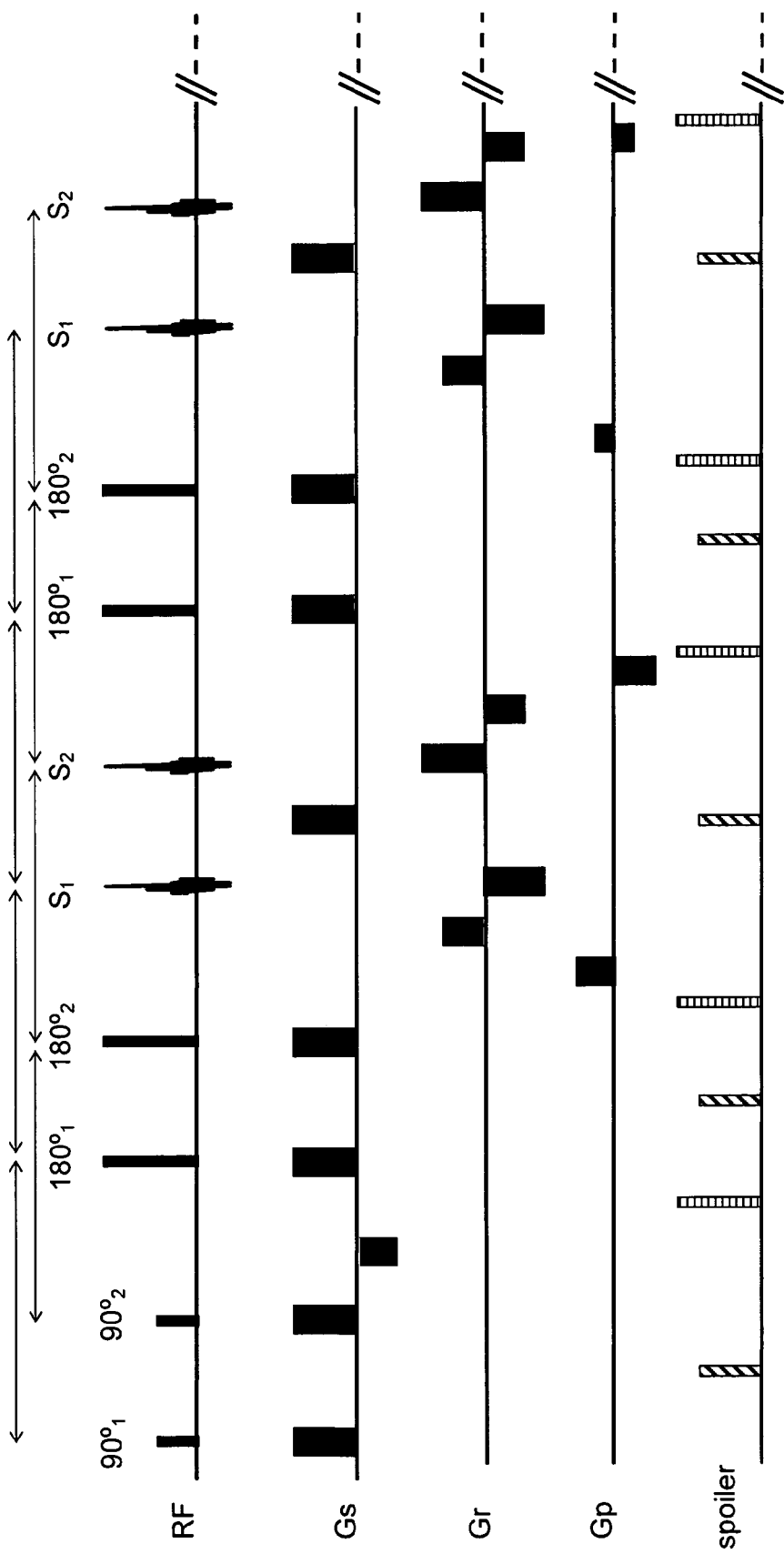
FIG. 1 shows a multiplex RARE sequence for two slices.

The main ideas are illustrated in FIG. 1, which shows an implementation of the novel sequence for two slices. The subscripts refer to the slice number corresponding to the 90°, 180° and spin-echoes (S). On the slice gradient channel (Gs), all solid rectangles above the line are equal in area. Note that they have multiple purposes. For example, a solid rectangle acting as the slice selection gradient lobe for one slice also acts simultaneously as spoiler for the other slices, and so on. The solid rectangle below the line serves to refocus the excitation in all slices and is approximately half the area of a solid rectangle above the line. All diagonally shaded rectangles have the same area, and provide optional additional dephasing between slices. All horizontally shaded rectangles have the same area, and provide spoiling of fids generated by imperfect refocusing pulses. These dephasing spoiler lobes may be added to the slice, phase encoding, or frequency encoding channels without compromising CPMG conditions.

At the spin-echo point for one slice, for example indicated by $S_1$, only the signal from slice 1 has been rephased in the slice direction. If, for example, the spoiler is switched along the slice axis, the signal from slice 2 has been dephased by a gradient moment corresponding to one solid and one diagonally shaded rectangle. Applying a gradient lobe of this area will rephase slice 2 and dephase slice 1. There will be crosstalk between slices if the gradient lobe is insufficient to dephase the entire signal from one slice, for example because of susceptibility gradients. Crosstalk will be reduced with thinner slices and a larger dephasing moment.

At the top of the FIG. 1 are shown arrows of equal length. They indicate that the excitation pulse, refocusing pulses and spin-echoes for each slice are separated by the same interval, thereby fulfilling one of the CPMG conditions. It can be seen that for each slice, on all gradient axes, the total gradient area between two consecutive refocusing pulses is twice the gradient area between its excitation and the first refocusing pulse. This fulfils the second CPMG requirement. Because the CPMG conditions are fulfilled, this means that refocusing pulse angle schemes, spoiler gradients and k-space trajectories designed for RARE, or hyperecho sequences, or their variants, may be used.

Figure 2:
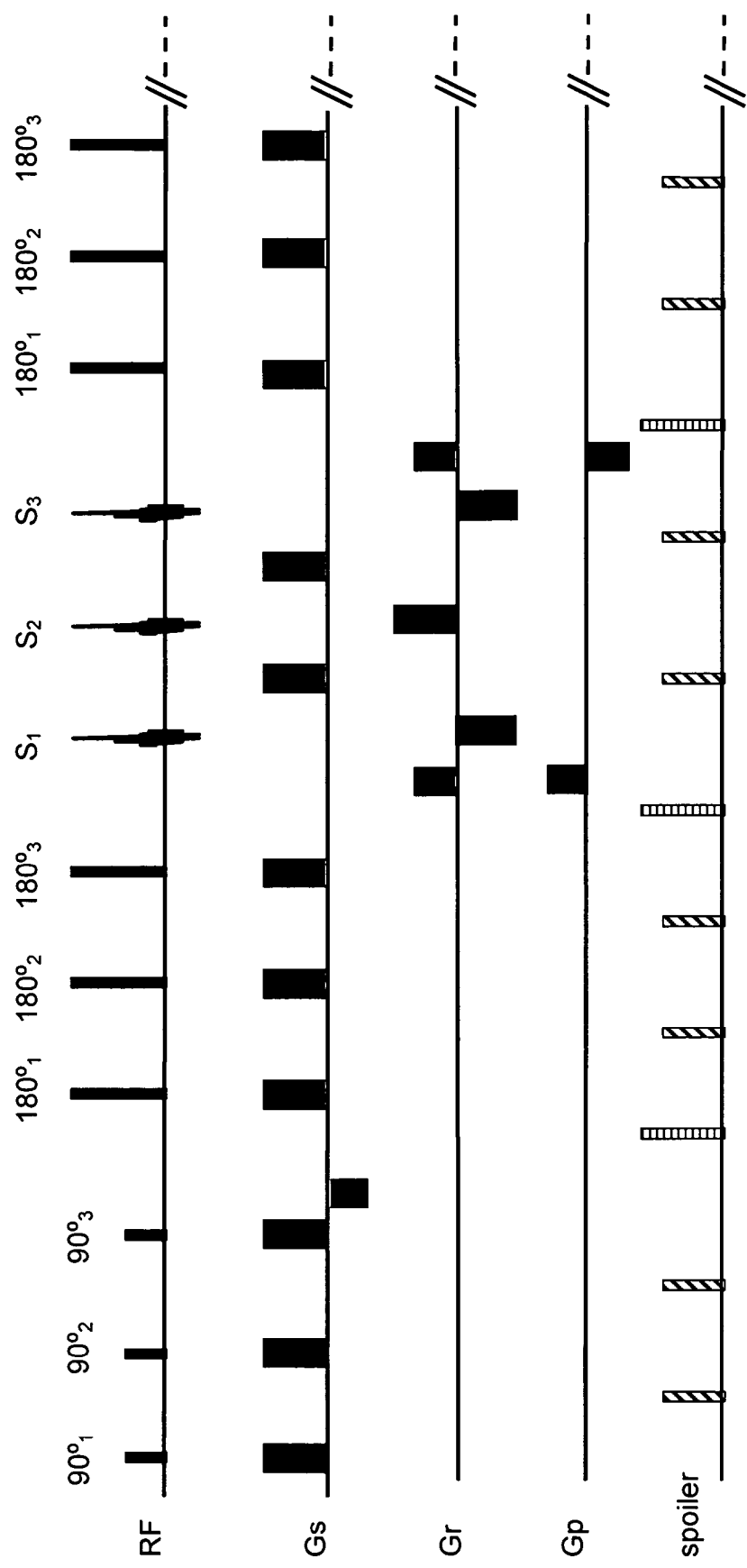
FIG. 2 shows a multiplex RARE sequence for three slices.

The sequence can be extended to any number of slices. As an example, a three slice sequence is shown in FIG. 2.

Figure 3:
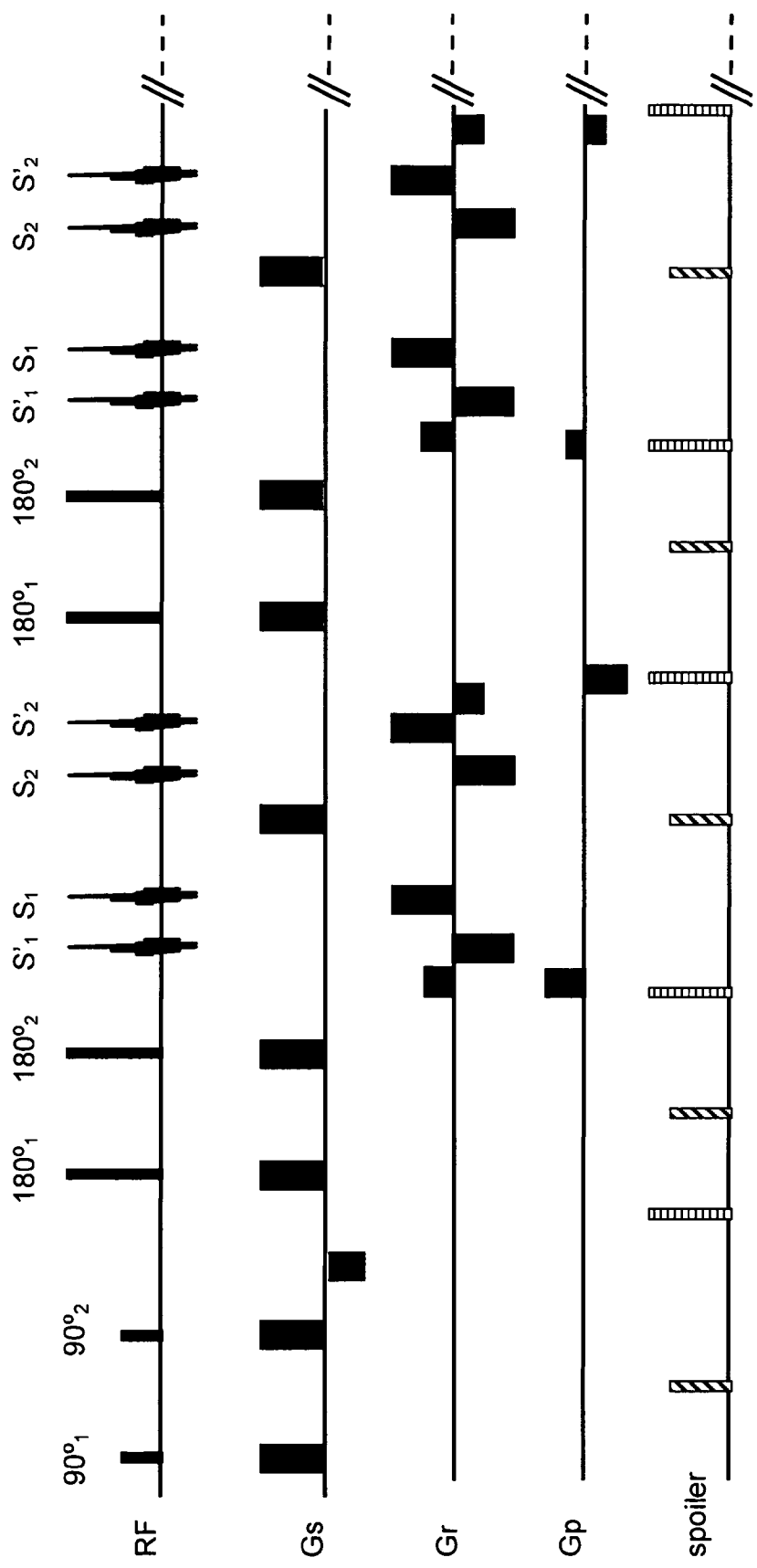
FIG. 3 shows dual slice multiplex RARE sequence modified to include gradient echoes for Dixon fat-water separation.
Figure 4:
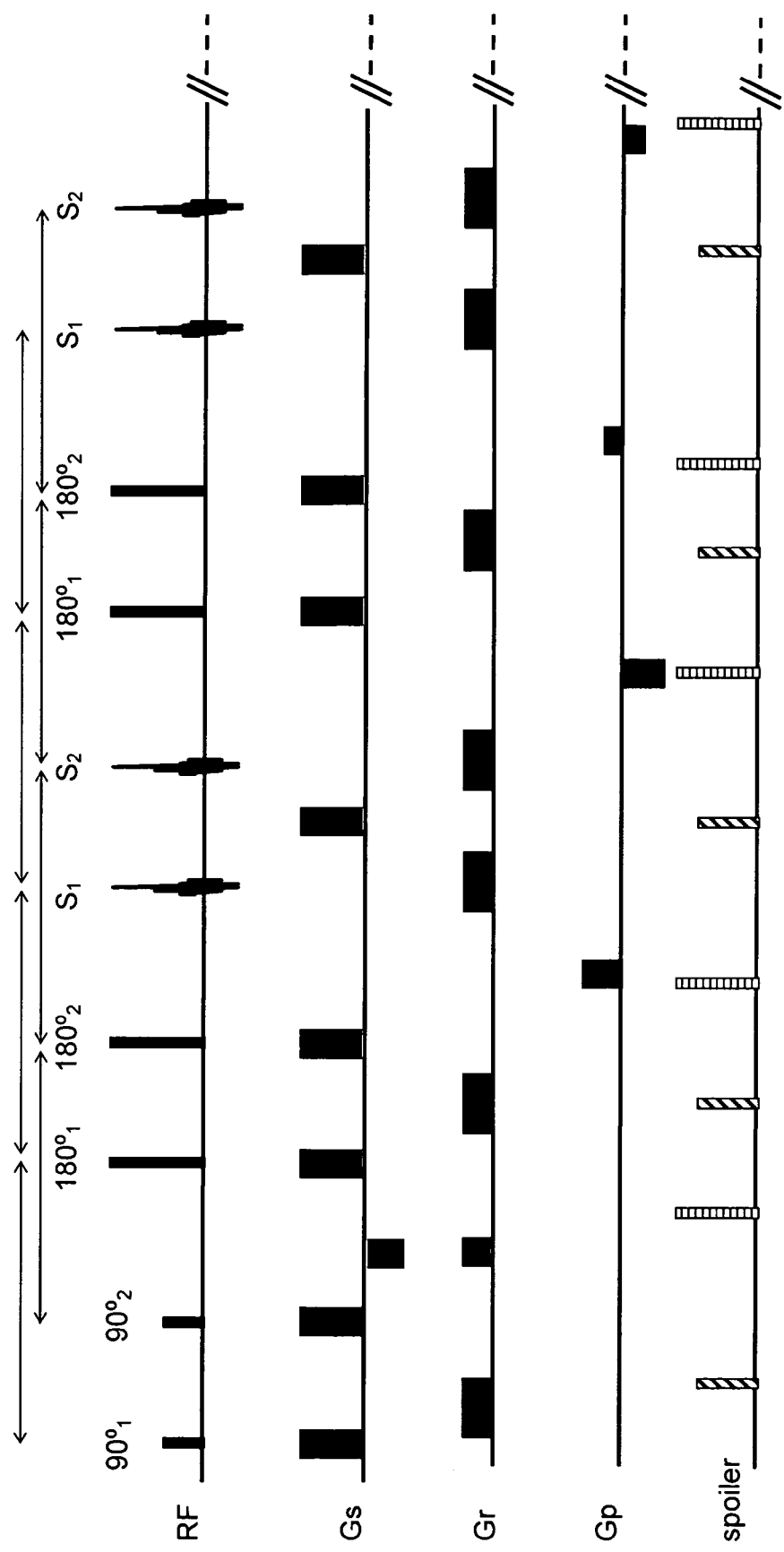
FIG. 4 shows a variation of the method according to FIG. 1 obtained by adding spoiler lobes to read gradient channel.
Figure 5:
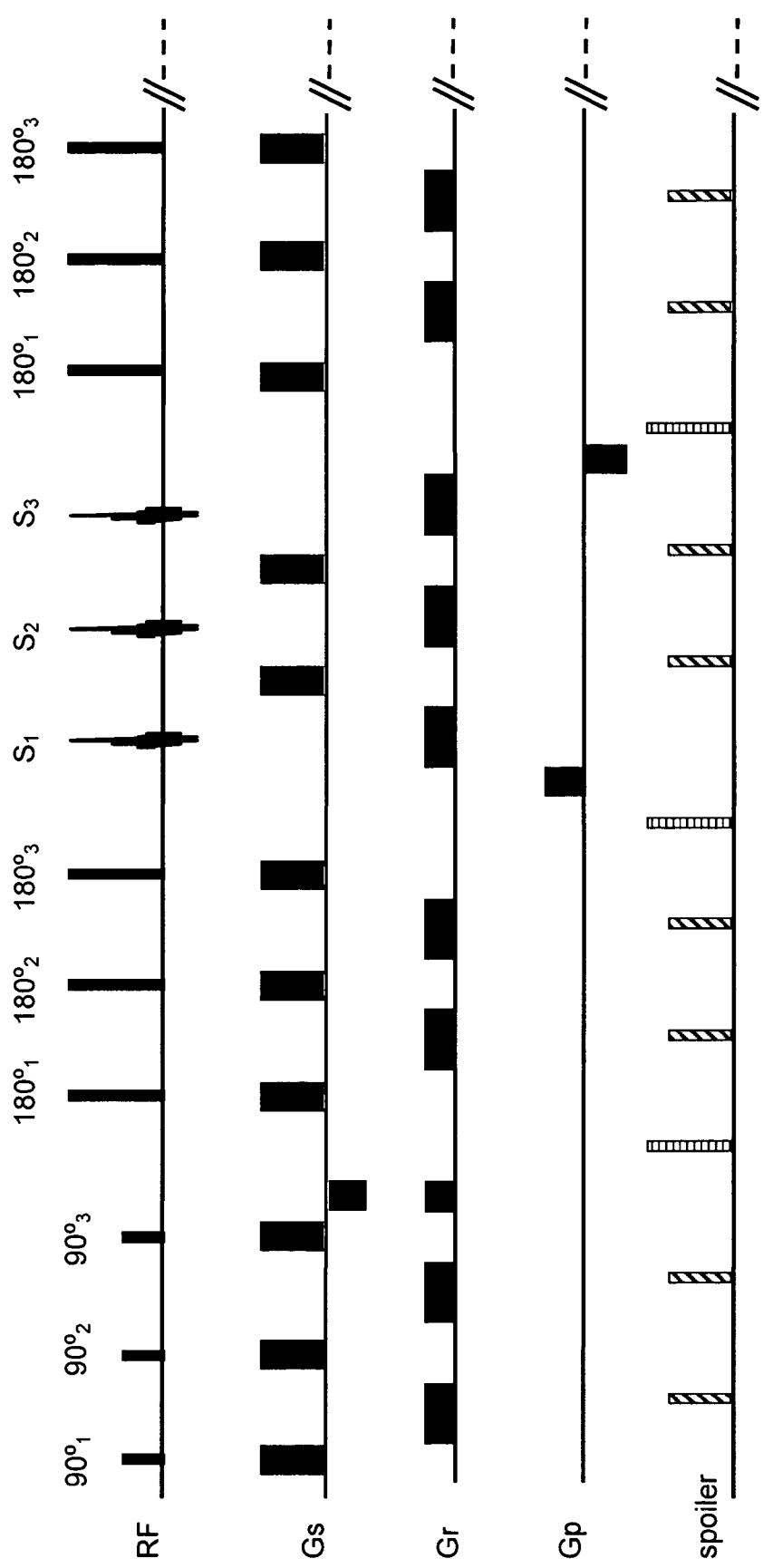
FIG. 5 shows a variation of the method according to FIG. 2 obtained by adding spoiler lobes to read gradient channel.
Figure 6:
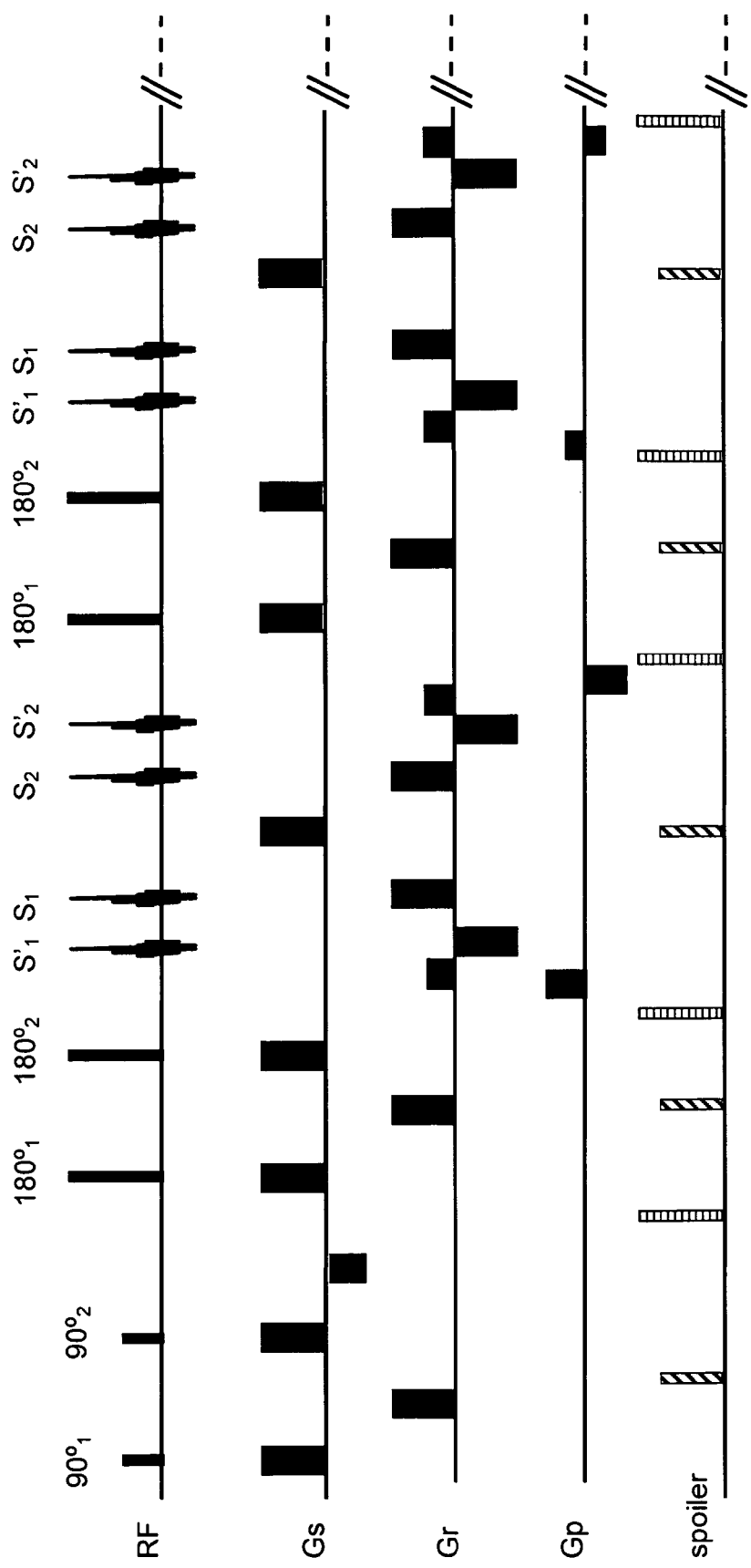
FIG. 6 shows a variation of the method according to FIG. 3 obtained by adding spoiler lobes to read gradient channel.
Figure 7:
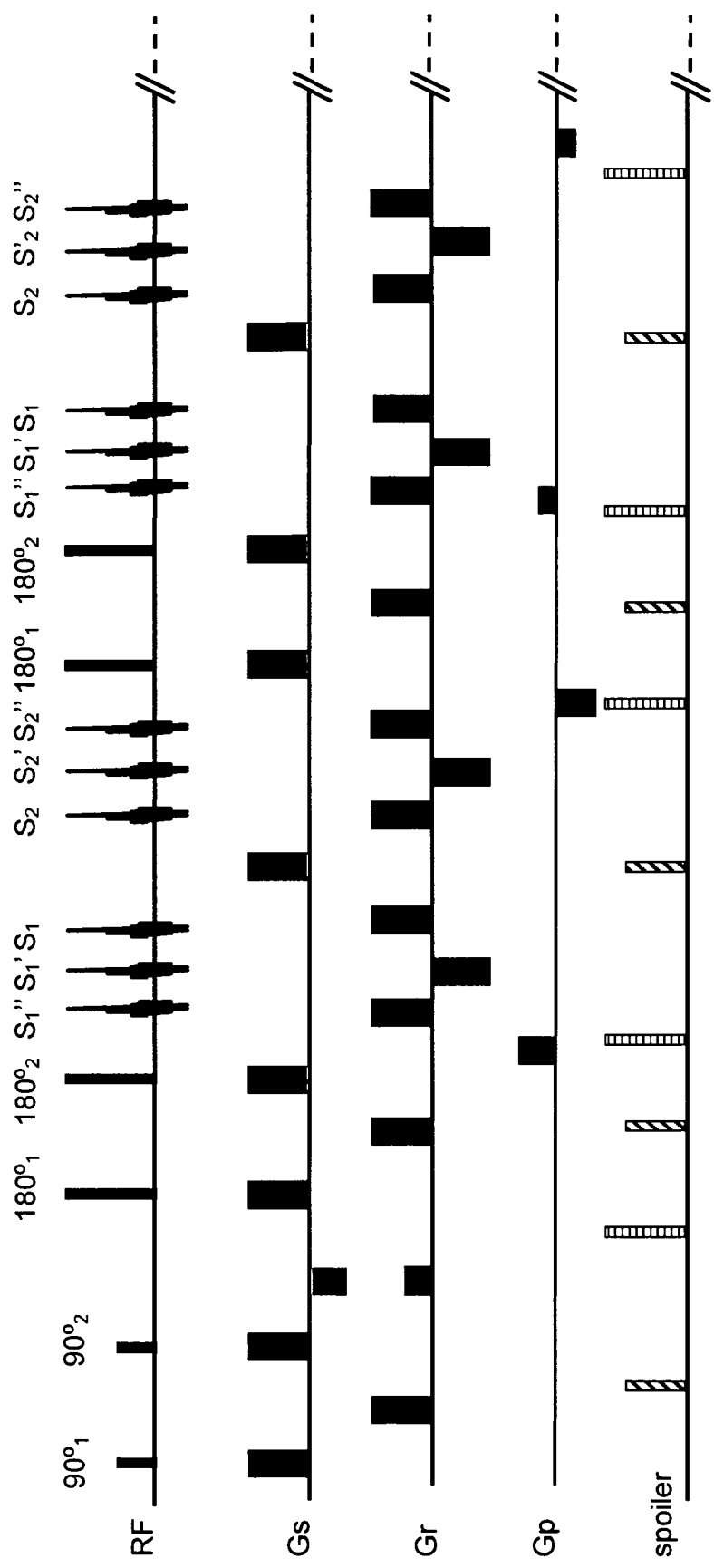
FIG. 7 shows a variation for a 3 point Dixon sequence.
Figure 8:
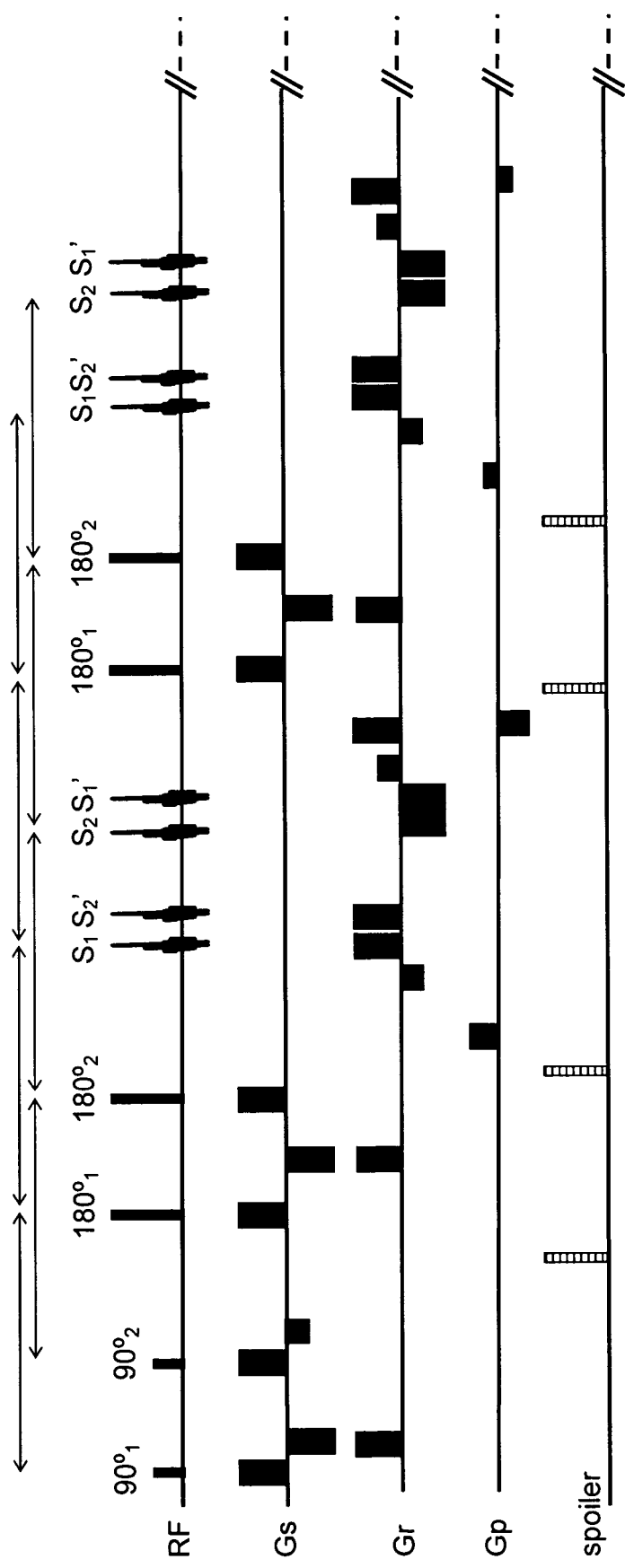
FIG. 8 shows a variation of the method according to FIG. 3 obtained by adding negative spoiler lobes to slice select channel and adding positive spoiler lobes to read channel.

An example of how the sequence may be modified for RARE Dixon fat-water imaging is shown in FIG. 3. Compared with FIG. 1, new read gradient lobes have been added to encode gradient-echoes, which are shown with a prime e.g. $S'_1$. The fat and water vectors will be parallel in the spin-echoes, but not in the gradient-echoes. The spin-echo and gradient-echo can then be combined using a two-point Dixon algorithm, for example [6], to yield fat and water images. The advantage of using this sequence compared with other implementations combining RARE and Dixon e.g. [7], is that gradient-echoes from one slice are collected only on one side of the spin-echo, and the time on the other side of the spin-echo is used to collect echoes from the other slice. This enables two slices to be collected without substantially increasing the spacing between refocusing pulses. This means that the minimum time required to collect a set of slices is reduced. The sequence may be easily modified for Dixon sequences that use more than two time points e.g. three-point Dixon [8], or IDEAL [9].

As mentioned above, gradient lobes shown in the spoiler channel may be added or subtracted to the slice, phase encode or frequency encode channels without affecting the CPMG conditions. In this way, variants of the basic idea can be obtained. Some of those variants are shown in FIGS. 4 through 8.

The sequence may also be adapted for 3D volume encoding by using slab excitation/refocusing pulses in combination with partition encoding in the slice direction.

Figure 9:
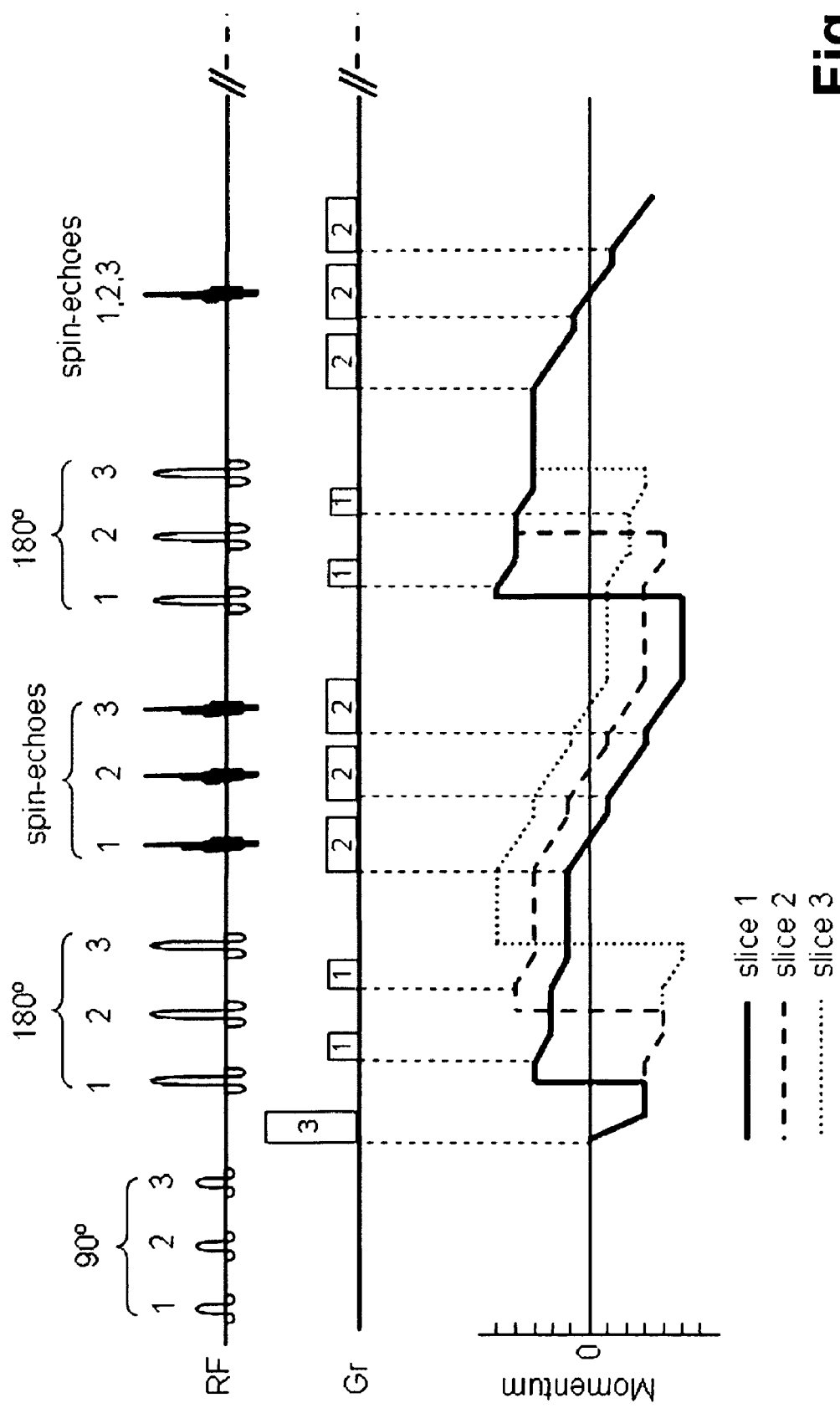
FIG. 9 shows a replication of three pulses disclosed in U.S. Pat. No. 5,237,273 to refocus multiple times the echoes S1, S2 and S3 disclosed in said prior art patent.

To get from methods known from prior art, for example U.S. Pat. No. 5,237,273, to the inventive method presented here is not a trivial task as is demonstrated in FIG. 9. If one would, for example, replicate the three refocusing pulses disclosed in U.S. Pat. No. 5,237,273 (FIG. 3) to refocus multiple times the echoes S1, S2 and S3 disclosed in said prior art patent (FIG. 3) to accelerate acquisition time, one would get the pulse sequence depicted in FIG. 9.

Figure 10:
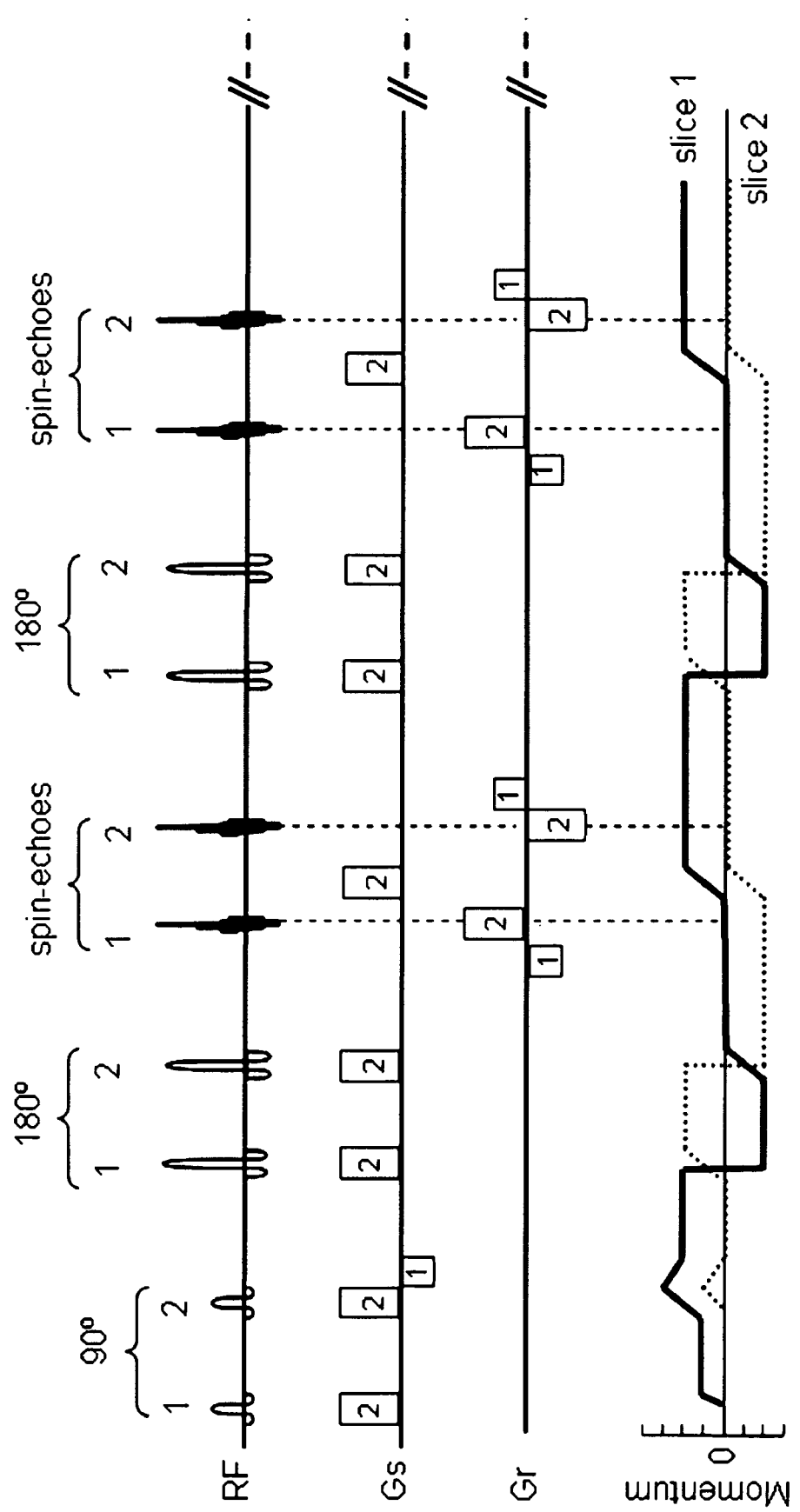
FIG. 10 shows a multiplex RARE sequence, demonstrating that phase dispersion fulfils the CPMG condition.

The CPMG condition has two parts: (i) the spacing between refocusing pulses must be twice that between the excitation and the first refocusing pulse, and (ii) the phase accumulated in all gradient directions between consecutive refocusing pulses must be the same. The sequence in FIG. 9 fulfils part (i), but as one can see from considering the momentum (or phase dispersion), of each slice in the readout direction, part (ii) is not met. In this case, echoes from all slices will refocus together in the same position in the second echo. Even if the refocusing pulses as disclosed in FIG. 7 of U.S. Pat. No. 5,237,273 are replicated in the same way, it can be shown similarly that the CPMG condition is not met for that case either. The new inventive sequence makes the necessary modifications to ensure that all parts of the CPMG condition are met for every echo in the spin-echo train (see FIG. 10).

LITERATURE

[1] Hahn, E. L., Spin Echoes. Physical Review, 1950. 80: p. 580-594.

[2] Hennig, J., A. Nauerth, and H. Friedburg, *RARE imaging: a fast imaging method for clinical MR*. Magn Reson Med., 1986. 3(6): p. 823-833.

[3] Hennig, J. and K. Scheffler, *Hyperechoes*. Magn Reson Med, 2001. 46(1): p. 6-12.

[4] Feinberg, D. A., *Simultaneous image refocusing* U.S. Pat. No. 6,614,225.

[5] Gunther, M. and D. A. Feinberg, *Simultaneous spin-echo refocusing*. Magnetic Resonance in Medicine, 2005. 54(3): p. 513-523.

[6] Xiang, Q. S., *Two-point water-fat imaging with partially-opposed-phase (POP) acquisition: an asymmetric Dixon method*. Magn Reson Med, 2006. 56(3): p. 572-84.

[7] Ma, J. F., et al., *Fast spin-echo triple-echo Dixon (fTED) technique for efficient T-2-weighted water and fat imaging*. Magnetic Resonance in Medicine, 2007. 58(1): p. 103-109.

[8] Glover, G. H., *Multipoint Dixon technique for water and fat proton and susceptibility imaging.* J Magn Reson Imaging, 1991. 1(5): p. 521-30.

[9] Reeder, S. B., et al., *Multicoil Dixon chemical species separation with an iterative least-squares estimation method.* Magn Reson Med, 2004. 51(1): p. 35-45.

We claim:

1. A method of performing multiplex RARE magnetic resonance imaging having slice selective excitation of two or more slices and of one or more nuclei followed by a refocusing of these slices and an application of gradient pulses, which cause a division of the signal into spin echoes and stimulated echoes, the method comprising the steps of:
   a) performing slice selective excitation of two or more slices and of one or more nuclei;
   b) applying, following step a), refocusing slice selective RF pulses, which are placed in order to fulfill an echo-spacing CPMG condition for each slice;
   c) arranging the gradient pulses, which cause a phase accumulated by spins in each slice between two consecutive refocusing RF pulses corresponding to that slice to be equal, thus fulfilling a CPMG phase accumulation condition; and
   d) measuring and analyzing NMR signals emanating from the one or more nuclei in order to complete the multiplex RARE magnetic resonance imaging method.

2. The method of claim 1, wherein one or more of the applied gradient pulses of a given slice are arranged in order to be used as spoiler gradients with respect to other slices of the two or more slices.

3. The method of claim 1, wherein the two or more slices occupy a same position, but correspond to different precession frequencies of a targeted nuclei.

4. The method of claim 1, wherein flip angles of all excitation pulses and all refocusing pulses are varied independently of each other.

5. The method of claim 1, wherein the gradient pulses are arranged in order to perform mufti-echo Dixon imaging.

6. The method of claim 1, wherein preparatory pulses are used in addition to slice excitation pulses in order to obtain different contrasts.

7. The method of claim 6, wherein inversion pulses or fat saturation pulses are used as preparatory pulses.

8. The method of claim 1, wherein asymmetric echoes are acquired.

9. The method of claim 8, wherein the asymmetric echoes are used in performing a partial Fourier reconstruction.

* * * * *